United States Patent
Nambu et al.

(10) Patent No.: US 6,800,878 B2
(45) Date of Patent: Oct. 5, 2004

(54) FIELD-EFFECT TYPE COMPOUND SEMICONDUCTOR DEVICE AND METHOD FOR FABRICATING THE SAME

(75) Inventors: Kazuo Nambu, Yamanashi (JP); Junichiro Nikaido, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 10/298,950

(22) Filed: Nov. 19, 2002

(65) Prior Publication Data

US 2003/0098477 A1 May 29, 2003

(30) Foreign Application Priority Data

Nov. 27, 2001 (JP) ........................................ 2001-360248

(51) Int. Cl.[7] .......................................... H01L 31/0328
(52) U.S. Cl. ........................ 257/194; 257/98; 257/192; 257/280
(58) Field of Search .......................... 257/98, 192, 194, 257/280, 15

(56) References Cited

U.S. PATENT DOCUMENTS

| | | | | |
|---|---|---|---|---|
| 5,739,558 A | * | 4/1998 | Ishida et al. | 257/192 |
| 5,952,672 A | * | 9/1999 | Kikkawa | 257/15 |
| 6,072,203 A | * | 6/2000 | Nozaki et al. | 257/194 |
| 6,144,049 A | * | 11/2000 | Onda | 257/194 |
| 6,274,893 B1 | * | 8/2001 | Igarashi et al. | 257/192 |
| 6,586,319 B1 | * | 7/2003 | Hirano | 438/574 |

FOREIGN PATENT DOCUMENTS

| | | |
|---|---|---|
| JP | 4-298050 | 10/1992 |
| JP | 7-38091 | 2/1995 |
| JP | 11-243058 | 9/1999 |
| JP | 2000-174262 | 6/2000 |
| JP | 2000-312000 | 11/2000 |

OTHER PUBLICATIONS

Japanese Office Action dated Feb. 3, 2004.

* cited by examiner

*Primary Examiner*—David Nelms
*Assistant Examiner*—Dao H. Nguyen
(74) *Attorney, Agent, or Firm*—Armstrong, Kratz, Quintos, Hanson & Brooks, LLP

(57) ABSTRACT

At least a channel layer and an etching stopper layer are provided on a semiconductor substrate in order, a gate electrode that Schottky-contacts the etching stopper layer is provided on the etching stopper layer, and InGaP having an In composition ratio of 0.66 through 0.9 is used as the etching stopper layer in a field effect type compound semiconductor device.

15 Claims, 3 Drawing Sheets

FIELD-EFFECT TYPE COMPOUND SEMICONDUCTOR DEVICE AND METHOD FOR FABRICATING THE SAME

BACKGROUND OF THE INVENTION

1. Field of the Invention

The present invention generally relates to field effect type compound semiconductor devices and methods for fabricating the same. More particularly, the present invention relates to a field effect type compound semiconductor device and a method for fabricating the same, wherein an etching stopper layer has a specific structure. The etching stopper layer according to the present invention can make a reduction in a temperature change $\Delta\phi_B$ of an electric potential barrier $\phi_B$ of a gate electrode accompanied by an etching process to form a gate recess structure in such as a HEMT (High Electron Mobility Transistor).

2. Description of the Related Art

There is a problem of an interface level in the field of an electronic device using a compound semiconductor such as GaAs or InP forming a ultra-high integrated circuit device or a high frequency amplifier element. Because of this, a field effect type compound semiconductor element such as a MESFET (Metal Semiconductor Field Effect Transistor) or the HEMT is used.

FIG. 1 is a schematically cross sectional view of a conventional HEMT.

Referring to FIG. 1, an i-type InAlAs buffer layer 42 is stacked on a semi-insulating GaAs substrate 41. An i-type InGaAs electron translation layer 43, an n-type InAlAs electron supply layer 45, an i-type InAlP stopper etching layer 46, and an n-type InGaAs cap layer 47 are epitaxially grown, in order, on the i-type InAlAs buffer layer 42. After that, a source electrode 48 and a drain electrode 49 are formed by a AuGe layer and a Au layer.

A two-dimensional electron gas 44 is formed at a side of the i-type InGaAs electron translation layer 43 of an interface between the i-type InGaAs electron translation layer 43 and the n-type InAlAs electron supply layer 45. The two-dimensional electron gas 44 is formed based on a bend of an energy band due to a difference of a forbidden band width $E_g$ and an electron affinity $\chi$ between the i-type InGaAs electron translation layer 43 and the n-type InAlAs electron supply layer 45.

Next, after a gate recess area is formed by a selective etching using a phosphoric acid group etchant made by $H_3PO_4: H_2O_2: H_2O$, a gate electrode 50 is formed from a Ti layer, a Pt layer, and an Au layer, so that a basic structure of the HEMT can be accomplished.

In the above conventional HEMT, a GaAs buffer layer may be used as the buffer layer. An n-type AlGaAs electron supply layer may be used as a carrier supply layer.

Other than InAlP, InP having a fine etching selectivity to AlGaAs or InGaAs may be used as the etching stopper layer.

However, in a case where the etching stopper is used, as described above, in order to improve precision of forming a gate recess structure, a temperature changing ratio ($\Delta\phi_B/\phi_B$) of the electric potential barrier $\phi_B$ between the etching stopper layer and the gate electrode increases extremely so that operation of the semiconductor device becomes unstable. This causes a practical problem.

FIG. 2 is a view for explanation of an InAlP composition dependence of the temperature changing ratio of the electric potential barrier. That is, FIG. 2 shows the InAlP composition dependence of the temperature changing ratio ($\Delta\phi_B/\phi_B$) of the electric potential barrier between room temperature and 250° C. As shown in FIG. 2, in a case of InP where the In composition ratio is 1.0, the electric potential barrier has a little bigger temperature changing ratio ($\Delta\phi_B/\phi_B$) than 22%. In addition, FIG. 2 shows that in a case where the In composition ratio is between 0.6 and 0.7, the temperature changing ratio exceeds 40%.

Particularly, surface oxidation of Al progresses with time passing in a case of InAlP, so that a depletion layer situated at both sides of the gate electrode extends and thereby a reduction of electric current is caused on a long term basis. Because of this, reliability of the semiconductor device is deteriorated.

In addition, since fluorine group gas used in a dry etching process exists unavoidably in a manufacturing factory, F (fluorine) combines with Al on the surface of the InAlP so that an F atom diffuses to an inside of the InAlP during an operation of the device. Hence, F acts an acceptor so that a carrier is compensated.

SUMMARY OF THE INVENTION

Accordingly, it is a general object of the present invention to provide a novel and useful field effect type compound semiconductor device and method for fabricating the same in which one or more of the problems described above are eliminated.

Another and more specific object of the present invention is to effectively reduce the temperature changing of the electric potential barrier of the gate electrode. FIG. 3 is a view of a principle structure of the present invention.

The above objects of the present invention are achieved by a field effect type compound semiconductor device, wherein at least a channel layer and an etching stopper layer are provided on a semiconductor substrate in order, a gate electrode that Schottky-contacts the etching stopper layer is provided on the etching stopper layer, and InGaP having an In composition ratio of 0.66 through 0.9 is used as the etching stopper layer.

According to the present invention as described above, the temperature changing ratio ($\Delta\phi_B/\phi_B$) of an electric potential barrier $\phi_B$ of the gate electrode 10 from room temperature to 250° C. becomes less than 10%. Hence, it is possible to improve reliability of the field effect type compound semiconductor device.

A cap layer 9 may be provided on the etching stopper layer 8 situated at both sides of the gate electrode 10, and a source electrode 11 and a drain electrode 12 may be provided on the cap layer 9.

According to the present invention as described above, it is possible to improve the ohmic performance of the source electrode 11 and the drain electrode 12.

InGaAs may be used as the cap layer 9.

InGaAs has a small forbidden band width and large mobility. Hence, contact resistance of the source electrode 11 and the drain electrode 12 may be further decreased.

The channel layer 3 may be a carrier translation layer, and a carrier supply layer 6 generating a two-dimensional carrier gas 4 may be provided at a side of the carrier translation layer between the carrier translation layer and the etching stopper layer 8.

The present invention can be applied to an usual MESFET (Metal Semiconductor Field Effect Transistor, Schottky-gate field-effect transistor). It is possible to fabricate a HEMT type field effect compound semiconductor device that can operate at more high-speed, by providing the carrier supply layer 6 generating the two-dimensional carrier gas 4 at the side of the carrier translation layer.

An intermediate layer consisting of an i-type barrier layer 7 may be provided between the carrier supply layer 6 and the etching stopper layer 8.

It is possible to assure a suitable breakdown voltage by providing the i-type barrier layer 7. Here, the thicker the barrier layer 7 is or the wider the forbidden band width is, the more the breakdown voltage is improved.

An intermediate layer consisting of an i-type spacer layer 5 may be provided between the carrier supply layer 6 and the carrier translation layer.

It is possible to control the two-dimensional carrier gas 4 by providing the i-type spacer layer 5. Here, the thicker the spacer layer 5 is, the higher the carrier mobility at the two-dimensional carrier gas 4 becomes and the more the sheet density of the carrier reduces.

The intermediate layer may consist of an i-type InAlAs layer having an In composition ratio of 0.3 through 0.4.

It is preferable to use the i-type InAlAs layer having the In composition ratio 0.3 through 0.4 which is lattice-matched to InGaAs having a high carrier mobility, as the intermediate layer.

The semiconductor substrate 1 and the channel layer 3 may have a lattice strain (lattice-mismatched) group structure each having a different lattice constant. The semiconductor substrate is made of GaAs.

Thus, because of the lattice strain group structure, it is possible to use a wafer that has a large diameter and can be obtained easily, such as the GaAs substrate, as the semiconductor substrate 1.

A buffer layer 2 relaxing lattice mismatching may be provided between the semiconductor substrate 1 and the channel layer 3. The composition of the buffer layer 2 may be graded.

Thus, it is preferable to provide the buffer layer 2 relaxing a lattice mismatching between the semiconductor substrate 1 and the channel layer 3, particularly a graded buffer layer in which the composition is graded, in a case of providing the lattice strain group structure.

The semiconductor substrate and the channel layer may belong to a group where lattice constants are substantially the same. In this case, the semiconductor substrate may be made of InP.

The above object of the present invention is also achieved by a method for fabricating a field effect type compound semiconductor device, including the steps of: (a) stacking at least a channel layer 3, an etching stopper layer made 8 of InGaP having an In composition ratio of 0.66 through 0.9, and a cap layer 9 on a semiconductor substrate 1 in order, (b) forming a gate recess part by etching-off a part of the cap layer 9 selectively, and (c) providing a gate electrode 10 on the surface of the etching stopper layer 8 that is exposed to the gate recess part.

It is possible to use a large selective etching ratio and reduce the temperature changing ratio ($\Delta\phi_B/\phi_B$) of an electric potential barrier $\phi_B$ of the gate electrode 10 to less than 10%, by using an etching stopper layer 8 made of InGaP having the In composition ratio of 0.66 through 0.9.

Other objects, features, and advantages of the present invention will become more apparent from the following detailed description when read in conjunction with the accompanying drawings.

DETAILED DESCRIPTION OF THE PREFERED EMBODIMENTS

A description will now be given, with reference to FIGS. 4 and 5, of embodiments of the present invention.

Figure 1:
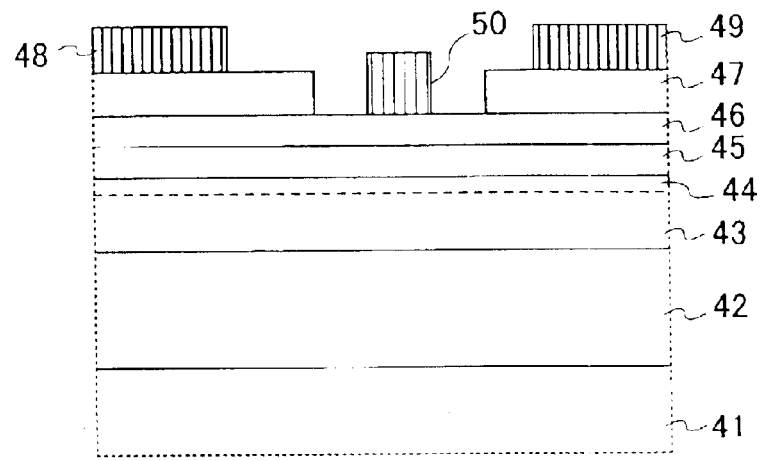
FIG. 1 is a schematic cross-sectional view of a conventional HEMT.
Figure 2:
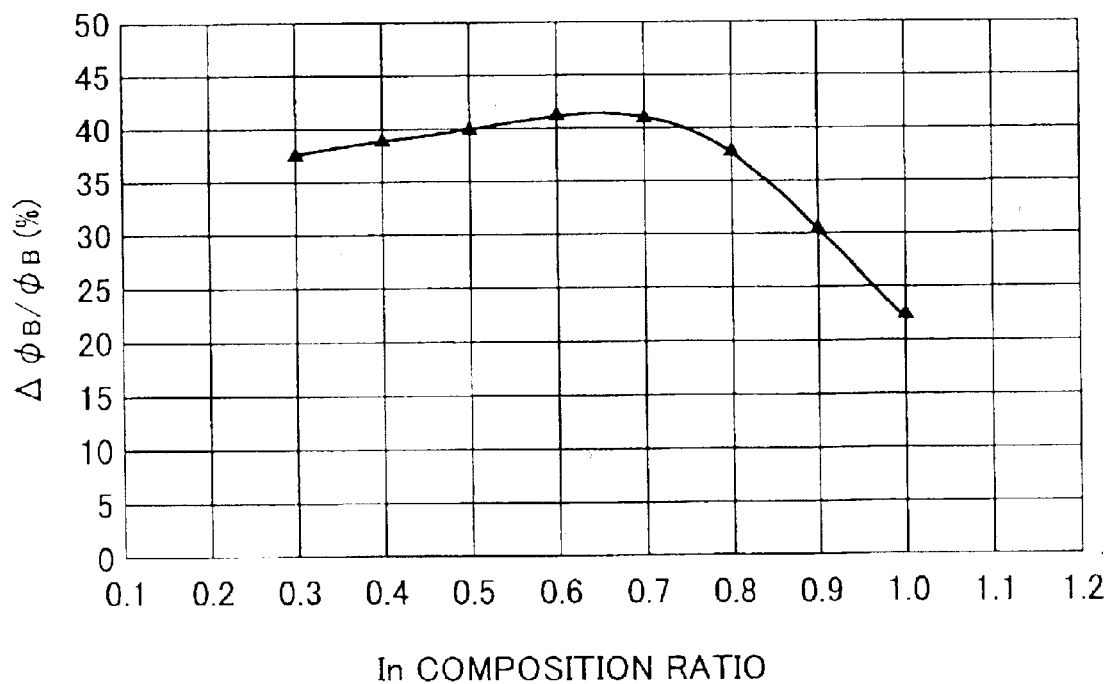
FIG. 2 is a view for explanation of a conventional InAlP composition dependence of the temperature changing ratio of the electric potential barrier.
Figure 3:
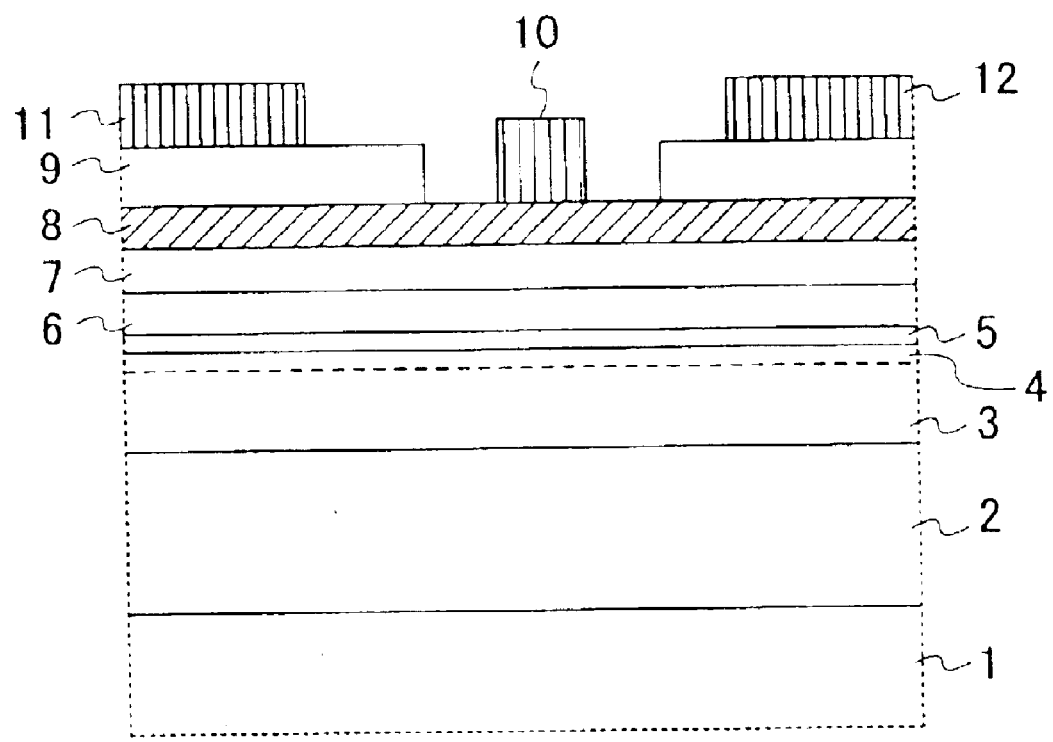
FIG. 3 is a view of a principle structure of the present invention.
Figure 4:
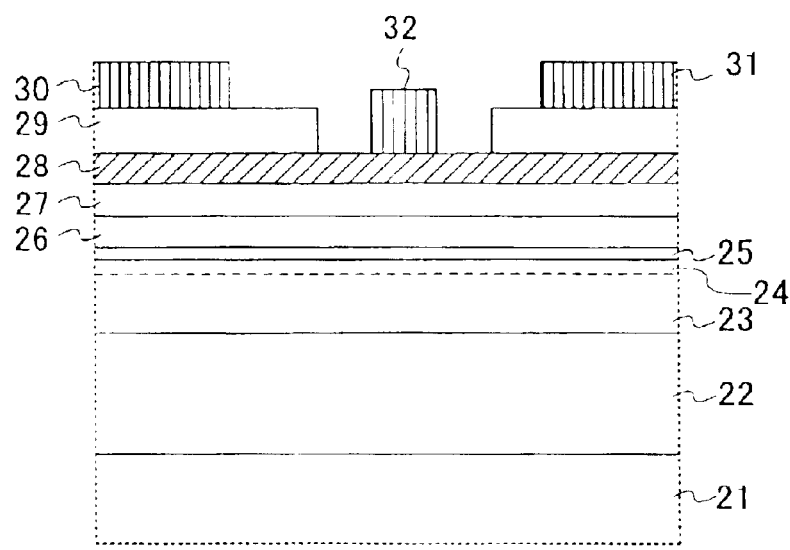
FIG. 4 is a schematic cross-sectional view of a HEMT according to the present invention.

FIG. 4 is a schematic cross-sectional view of a HEMT (High Electron Mobility Transistor) according to the present invention.

An i-type InAlAs buffer layer 22 is stacked on a semi-insulating GaAs substrate 21. The i-type InAlAs buffer layer 22 having 1 $\mu$m thickness for example, has an In composition ratio changing from 0 to 0.3 or 0.4, and grading from 0 to 0.4, for example. An i-type InGaAs electron translation layer 23, an i-type InAlAs spacer layer 25, an n-type InAlAs electron supply layer 26, an i-type InAlAs barrier layer 27, an i-type InGaP stopper layer 28, and an n-type InGaAs cap layer 29 are epitaxially grown, in order, on the the i-type InAlAs buffer layer 22. The i-type InGaAs electron translation layer 23 has an In composition ratio of 0.3 through 0.5, for example 0.4, and is 30 nm thick, for example. The i-type InAlAs spacer layer 25 has an In composition ratio of 0.3 through 0.4, for example 0.4, and is 3 nm thick, for example. The n-type InAlAs electron supply layer 26 has an In composition ratio of 0.3 through 0.4, for example 0.4, is 10 nm thick, for example, and has a carrier density of $2\times10^{18}$ cm$^{-3}$. The i-type InAlAs barrier layer 27 has an In composition ratio of 0.3 through 0.4, for example 0.4, and is 10 nm thick, for example. The i-type InGaP stopper layer 28 has an In composition ratio of 0.66 through 0.9, for example 0.9, and is 10 nm thick, for example. The n-type InGaAs cap layer 29 has an In composition ratio of 0.3 through 0.5, for example 0.4, is 100 nm thick, for example, and has a carrier density of $2\times10^{19}$ cm$^{-3}$.

A two-dimensional electron gas 24 is formed at the side of the i-type InAlAs spacer layer 25 within the i-type InGaAs electron translation layer 23. Electron mobility and sheet electron density of the two-dimensional electron gas 24 are controlled by the i-type InAlAs spacer layer 25. The thicker the i-type InAlAs spacer layer 25 is, the stronger the rejection of election against the n-type InAlAs electron supply layer 26 is, and thereby Coulomb's scattering of a donor becomes weak so that electron mobility becomes large but sheet electron density is reduced.

A property of two-dimensional electron gas is changed based on the thickness or density of the n-type InAlAs electron supply layer 26.

A gate breakdown voltage is controlled by the i-type InAlAs barrier layer 27. The thicker the i-type InAlAs barrier layer 27 or the smaller the In composition ratio is, the higher the gate breakdown voltage is.

Next, a drain electrode 31 and a source electrode 30 comprising of an AuGe layer having 50 nm thickness, an Ni layer having 5 nm thickness, and an Au layer having 200 nm thickness, are formed on the n-type InGaAs cap layer 29. After that, the n-type InGaAs cap layer 29 is etched selectively by a phosphoric acid group etchant wherein $H_3PO_4$: $H_2O_2$: $H_2O$ is 10:10:500, so that a gate recess part is formed.

A selective etching ratio between InGaP and InGaAs is, for example, 1:50. The i-type InGaP stopper layer 28 acts as a fine etching stopper layer.

The smaller the In composition ratio of the InGaP layer is, the more the selective etching ratio is reduced.

Next, a gate electrode 32 is formed by a lift off method in which a resist pattern is used for the gate recess part, so that a basic structure of the HEMT can be accomplished. The gate electrode 32 is formed from a Ti layer having 5 nm thickness, for example as a Schottky-contact stability metal, a Pt layer having 50 nm thickness of a barrier layer, for example, and a Au layer having 200 nm thickness of a low resistance metal.

One HEMT is described as aforesaid in order to simplify its description. However, in practice, an isolation is implemented by an ion implantation of $O_2$ so as to integrate a lot of HEMTs.

Figure 5:
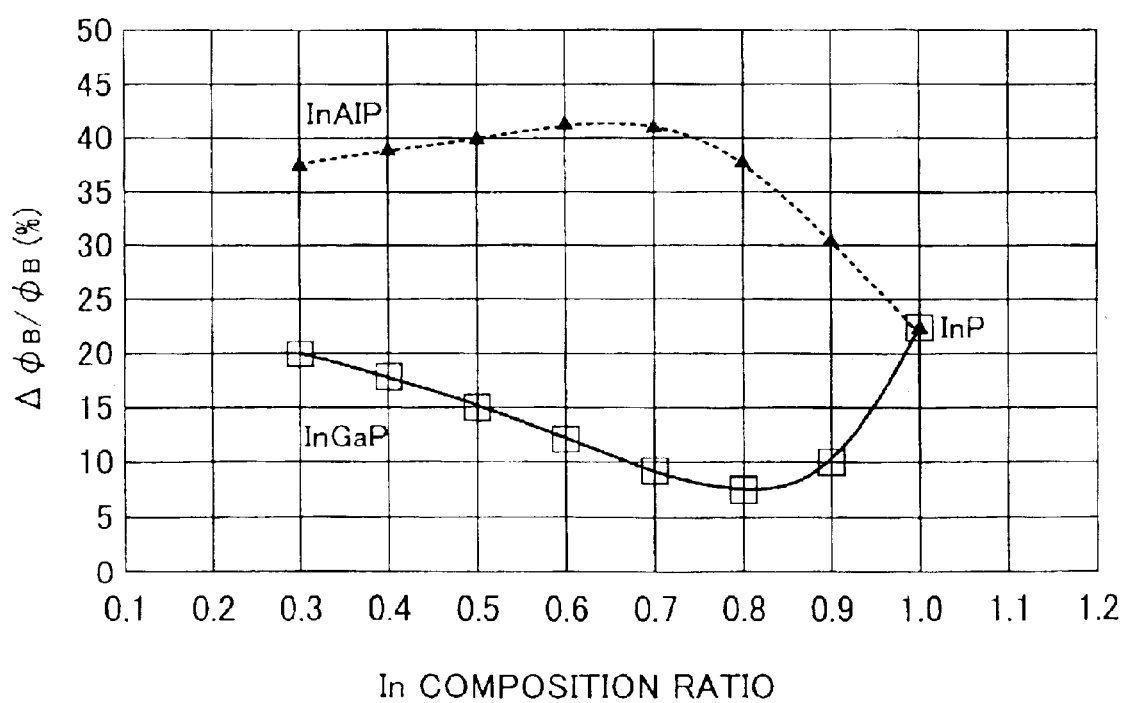
FIG. 5 is a graph for explanation of InGaP composition dependence of the temperature changing ratio of the electric potential barrier according to the present invention.

FIG. 5 is a graph for explanation of an InGaP composition dependence of the temperature changing ratio of the electric potential barrier. That is, FIG. 5 shows the InAGaP composition dependence of the temperature changing ratio ($\Delta\phi_B/\phi_B$) of the electric potential barrier between the gate electrode 32 and the InGaP etching stopper layer 28. As shown in FIG. 5, in a case where an In composition ratio is in a range of 0.66 through 0.9, the temperature changing ratio ($\Delta\phi_B/\phi_B$) becomes less than 10%, so that it is possible to obtain a stable operation of the device.

Although the In composition ratio of the i-type InGaP stopper layer 28 is preferably in the vicinity of 0.8 in terms of the temperature changing ratio ($\Delta\phi_B/\phi_B$), the In composition ratio is determined so as to be lattice-matched to the i-type InGaAs electron translation layer 23.

Thus, InGaP having the In composition ratio of 0.66 through 0.9 is used as the etching stopper layer in the embodiment of the present invention. Hence, it is possible to extremely reduce the temperature changing of the electric potential barrier in a state where fine selectivity etching is maintained. And thereby, it is possible to improve stability and reliability of am operation of the device.

In the meantime, it is known that the selective etching to the InGaAs cap layer becomes fine by applying InGaP as the electron supply layer. See Japanese Laid-Open Patent Application, No. 11-243058 if necessary. In this case, since the barrier layer cannot be provided, it is difficult to control the gate breakdown voltage independently and a difference of electron affinities between the n-type InGaP electron supply layer and the i-type InGaAs electron translation layer becomes small, so that it is impossible to obtain a desirable two-dimensional electron gas property.

The present invention is not limited to these embodiments, but variations and modifications may be made without departing from the scope of the present invention.

For example, although InAlAs is used as the buffer layer, the spacer layer, the electron supply layer, and the barrier layer bin the above mentioned embodiment, a quaternary compound crystal group such as InAlGaAs may be used.

Furthermore, although a GaAs substrate by which a wafer having a large diameter can be obtained easily is used so as to make a lattice strain group structure in the above mentioned embodiment, a substrate and an electron translation layer may be formed from a common group having substantially the same lattice constants. In such case, a ternary compound substrate or an InP substrate may be used.

Moreover, although a Ti/Pt/Au structure is used for the gate electrode in the above mentioned embodiment, a Ti/Au structure in which the barrier layer is eliminated, an Al structure of a sole Schottky metal, a Ti/Al structure in which a Schottky stable metal is used, and a Ti/Al/Pt/Au structure in which a low resistance metal is provided through the barrier layer, may be used for the gate electrode.

In addition, as the Schottky stable metal, Pd may be used instead of Ti, so that a Pd/Al/To structure in which Ti is used as a form stable metal and a Pd/Ti/Pt/Au structure in which Ti is used as the schottky metal, may be used for the gate electrode.

Furthermore, a WSi/Au structure or a TiW/Au structure in which WSi or TiW is used as the shottky metal, may be used for the gate electrode.

In any case, a material, not causing a change to the electrode form and having a stable schottky property on a long term basis and a low resistance, is preferable as a material for the gate electrode.

Moreover, although the present invention is explained as the n-type HEMT in the above embodiment, the present invention can be applied to a p-type HEMT. Particularly, in a case where the p-type HEMT of a complementary HEMT is structured, a p-type semiconductor may be used as a carrier supply layer and a cap layer.

In addition, although the present invention is explained as a HEMT in the above mentioned embodiment, the present invention may be applied to a usual MESFET (Metal Semiconductor Field Effect Transistor, Shottky-gate field-effect transistor).

This patent application is based on Japanese priority patent application No. 2001-360248 filed on Nov. 27, 2001, the entire contents of which are hereby incorporated by reference.

What is claimed is:

1. A field effect type compound semiconductor device, the device comprising:
at least a channel layer and an etching stopper layer being provided on a semiconductor substrate of the device in order;
a gate electrode that Schottky-contacts the etching stopper layer being provided on the etching stopper layer; and
InGaP having an In composition ratio of 0.66 through 0.9 being used as the etching stopper layer.

2. The field effect type compound semiconductor device as claimed in claim 1,
wherein a cap layer is provided on the etching stopper layer situated at both sides of the gate electrode, and
a source electrode and a drain electrode are provided on the cap layer.

3. The field effect type compound semiconductor device as claimed in claim 1,
wherein InGaAs is used as the cap layer.

4. The field effect type compound semiconductor device as claimed in claim 1,
wherein the channel layer is a carrier translation layer, and
a carrier supply layer generating a two-dimensional carrier gas is provided at a side of the carrier translation layer between the carrier translation layer and the etching stopper layer.

5. The field effect type compound semiconductor device as claimed in claim 4,
wherein an intermediate layer consisting of an i-type barrier layer is provided between the carrier supply layer and the etching stopper layer.

6. The field effect type compound semiconductor device as claimed in claim 5,
wherein the intermediate layer consists of an i-type InAlAs layer having an In composition ratio of 0.3 through 0.4.

7. The field effect type compound semiconductor device as claimed in claim 4,
wherein an intermediate layer consisting of an i-type spacer layer is provided between the carrier supply layer and the carrier translation layer.

8. The field effect type compound semiconductor device as claimed in claim 7,
wherein the intermediate layer consists of an i-type InAlAs layer having an In composition ratio of 0.3 through 0.4.

9. The field effect type compound semiconductor device as claimed in claim 1,
wherein the semiconductor substrate and the channel layer have a lattice strain group structure each having a different lattice constant.

10. The field effect type compound semiconductor device as claimed in claim 9,
wherein the semiconductor substrate is made of GaAs.

11. The field effect type compound semiconductor device as claimed in claim 10,
wherein a buffer layer relaxing a lattice mismatching is provided between the semiconductor substrate and the channel layer.

12. The field effect type compound semiconductor device as claimed in claim 11,
wherein composition of the buffer layer is graded.

13. The field effect type compound semiconductor device as claimed in claim 1,
wherein the semiconductor substrate and the channel layer belong to a group where lattice constants are substantially the same.

14. The field effect type compound semiconductor device as claimed in claim 13,
wherein the semiconductor substrate is made of InP.

15. The field effect type compound semiconductor device as claimed in claim 1,
wherein the gate electrode is made of at least one of Al, Ti/Al, Ti/Au, Ti/Pt/Au, Ti/Al/Pt/Au, Pd/Al/Ti, Pd/Ti/Pt/Au, WSi/Au, and TiW/Au.

\* \* \* \* \*